US012753524B2

(12) United States Patent
Moon et al.

(10) Patent No.: US 12,753,524 B2
(45) Date of Patent: Oct. 6, 2026

(54) DOUBLE LAYERED ELECTROLYTIC COPPER FOIL AND MANUFACTURING METHOD THEREOF

(71) Applicant: Volta Energy Solutions S.a.r.l., Luxembourg (LU)

(72) Inventors: Honggi Moon, Wiltz (LU); Sangbeom Kim, Wiltz (LU); Seunghwan Kim, Wiltz (LU)

(73) Assignee: VOLTA ENERGY SOLUTIONS S.A.R.L., Luxembourg (LU)

(*) Notice: Subject to any disclaimer, the term of this patent is extended or adjusted under 35 U.S.C. 154(b) by 851 days.

(21) Appl. No.: 17/988,405

(22) Filed: Nov. 16, 2022

(65) Prior Publication Data

US 2023/0203691 A1 Jun. 29, 2023

(30) Foreign Application Priority Data

Dec. 24, 2021 (WO) ................. PCT/EP2021/087638

(51) Int. Cl.

| | |
|---|---|
| ***C25D 1/04*** | (2006.01) |
| ***C25D 3/38*** | (2006.01) |
| ***C25D 5/10*** | (2006.01) |
| ***C25D 7/06*** | (2006.01) |
| ***H01M 4/66*** | (2006.01) |
| ***H05K 1/09*** | (2006.01) |
| ***H05K 3/20*** | (2006.01) |

(52) U.S. Cl.

CPC ................. *C25D 1/04* (2013.01); *C25D 3/38* (2013.01); *C25D 7/0614* (2013.01); *H01M 4/661* (2013.01); *H05K 1/09* (2013.01); *H05K 3/202* (2013.01); *H05K 2201/0355* (2013.01)

(58) Field of Classification Search

CPC .......... B32B 15/043; C25D 1/04; C25D 3/38; C25D 5/10

See application file for complete search history.

(56) References Cited

FOREIGN PATENT DOCUMENTS

| | | | |
|---|---|---|---|
| EP | 0 568 733 | B1 | 11/1997 |
| EP | 3 404 755 | A1 | 11/2018 |
| EP | 1 876 266 | B1 | 6/2020 |
| KR | 10-2008-0096415 | A | 10/2008 |
| KR | 10-2011-0023398 | A | 3/2011 |
| KR | 10-2019-0009048 | A | 1/2019 |
| WO | 2013/129588 | A1 | 9/2013 |
| WO | 2017/123034 | A1 | 7/2017 |

OTHER PUBLICATIONS

English translation of WO2013129588A1, obtained from EPO espacenet Nov. 6, 2025. (Year: 2025).*

English translation of KR20080096415A, obtained from EPO espacenet Nov. 6, 2025. (Year: 2025).*

* cited by examiner

*Primary Examiner* — Adam Krupicka

(74) *Attorney, Agent, or Firm* — Sughrue Mion, PLLC

(57) ABSTRACT

A double layered electrolytic copper foil is disclosed. It is possible to freely control various physical properties of the double layered electrolytic copper foil. The double layered electrolytic copper foil contains a first copper layer, a second copper layer, and an interface formed between one surface of the first copper layer and one surface of the second copper layer. A method of manufacturing the double layered electrolytic copper foil is also disclosed.

15 Claims, 6 Drawing Sheets

DOUBLE LAYERED ELECTROLYTIC COPPER FOIL AND MANUFACTURING METHOD THEREOF

CROSS REFERENCE TO RELATED APPLICATIONS

This application claims priority from PCT/EP2021/087638 filed Dec. 24, 2021, of which the entire content is incorporated by reference.

TECHNICAL FIELD

The present invention relates to a double layered electrolytic copper foil of which various physical properties may be freely controlled to be applicable to various technical fields, and to a method of manufacturing the same.

DISCUSSION OF RELATED ART

In general, an electrolytic copper foil is widely used as a basic material of a printed circuit board (PCB) used in the electric/electronic industry. Accordingly, the demand for such an electrolytic copper foil is rapidly increasing mainly in small products such as slim notebook computers, personal digital assistants (PDA), e-books, MP3 players, next-generation mobile phones, and ultra-thin flat panel displays. In addition, by improving the physical properties of the electrolytic copper foil, it is widely used as an anode (e.g., negative electrode) current collector of a secondary battery.

Such an electrolytic copper foil is prepared in a manner in which sulfuric acid-aqueous solution of copper sulfate is prepared as an electrolyte, a direct current is applied between an anode (e.g., a positive electrode) and a rotating cathode drum (e.g., a negative electrode) immersed in the electrolyte to precipitate an electrodeposited copper on a drum surface, and the precipitated copper electrodeposit is stripped off from the drum surface of the rotating cathode and continuously wound.

Meanwhile, in order to use the electrolytic copper foil as a printed circuit board or a current collector of a secondary battery, it should have various physical properties such as predetermined tensile strength and elongation. However, it is difficult to satisfy the desired physical properties of the copper foil only by the above-described foil-making process. In addition, in order to improve the physical properties of the electrolytic copper foil, it is necessary to perform a separate surface treatment, resulting in complexity of the process and an increase in manufacturing costs.

TECHNICAL OBJECTIVES

Aspects of embodiments of the present invention are directed to a double layered electrolytic copper foil of which various physical properties may be freely controlled by controlling process conditions such as electrolyte composition, current density, temperature, and/or agitation when manufacturing the double layered electrolytic copper foil, and a method of manufacturing the same.

Other objectives and advantages of the present invention may be more clearly explained by the following detailed description and claims.

Technical Solution to the Problem

According to an embodiment, a double layered electrolytic copper foil includes: a first copper layer; a second copper layer; and an interface formed between one surface of the first copper layer and one surface of the second copper layer.

In some embodiments, the first copper layer and the second copper layer may have different grain sizes or different crystal structures from each other.

In some embodiments, the first copper layer, the interface, and the second copper layer may be bonded in a continuous phase through a single electroplating process.

In some embodiments, a double layered structure including the first copper layer, the interface and the second copper layer may be identified by electron backscatter diffraction (EBSD) measured after heat treatment at 200° C. for 1 hour and before heat treatment.

In some embodiments, the interface may be positioned at a thickness in a range from 40 to 60% of a total thickness of the double layered electrolytic copper foil in a thickness direction of the double layered electrolytic copper foil.

In some embodiments, a thickness ratio of the first copper layer and the second copper layer may be in a range from 40:60 to 60:40.

In some embodiments, an elongation of the double layered electrolytic copper foil may be in a range from 3.0 to 25%, and a tensile strength of the double layered electrolytic copper foil may be in a range from 30 to 40 $kgf/mm^2$.

In some embodiments, a thickness of the double layered electrolytic copper foil may be in a range from 3 to 70 μm.

In some embodiments, the double layered electrolytic copper foil may include a drum surface and an electrolyte surface, and a roughness (Rz, ISO) of the electrolyte surface may be in a range from 1.0 to 5.0 μm.

In some embodiments, a difference in surface roughness between the drum surface and the electrolyte surface may be 1.0 μm or less.

In some embodiments, the double layered electrolytic copper foil may further include an anti-corrosion layer formed on another surface of the first copper layer and on another surface of the second copper layer.

In some embodiments, the double layered electrolytic copper foil may be applied to at least one of a copper clad laminate, a printed circuit board, and a current collector of a battery.

According to an embodiment, a method of manufacturing a double layered electrolytic copper foil by applying a current between an anode and a rotating cathode drum spaced apart from each other in an electrolytic bath in which an electrolyte is accommodated includes: a first step of electrodepositing a first copper layer on the rotating cathode drum by applying a current to the electrolyte; and a second step of electrodepositing a second copper layer on the first copper layer by applying a current to the electrolyte, wherein at least one of a concentration of copper ions included in the electrolyte, a current density, an electrolyte agitation, and an electrolyte temperature is different from each other between the first step and the second step.

In some embodiments, at least one of the concentration of copper ions included in the electrolyte, the electrolyte temperature and the electrolyte agitation circulated on a surface of the cathode drum in the first step may be greater than a corresponding one of the concentration of copper ions included in the electrolyte, the electrolyte temperature and the electrolyte agitation in the second step.

In some embodiments, the current density in the first step may be less than the current density in the second step.

In some embodiments, the electrolyte of the first step and the electrolyte of the second step may be different from each other and may each include copper ions; sulfuric acid; halogen; and at least one additive of a brightener, a leveler, a suppressor and a carrier.

In some embodiments, the method may further include: performing at least one of a nodule treatment and an anti-corrosion treatment on the electrodeposited double layered electrolytic copper foil.

Effects of the Invention

According to one or more embodiments of the present invention, a double layered electrolytic copper foil of which various physical properties may be freely controlled by controlling process conditions such as electrolyte composition, current density, temperature, and/or agitation when manufacturing the electrolytic copper foil, and a method of manufacturing the same may be provided.

Effects of the present invention are not limited by the contents exemplified above, and more various effects are included in the present specification.

REFERENCE NUMERAL

100: Double layered electrolytic copper foil
11: First copper layer
12: Second copper layer
13: Interface
20: Anti-corrosion layer
210: Anode
220: Rotating Cathode drum
230: Electrolyte input controller
231: First inlet
232: Second inlet
233: Valve
240: Electrolytic bath
250: Electrolyte
260: Electrolytic copper foil
270: Guide roll

BRIEF DESCRIPTION OF THE DRAWING PORTIONS

DETAILED DESCRIPTION OF THE INVENTION

Figure 1:
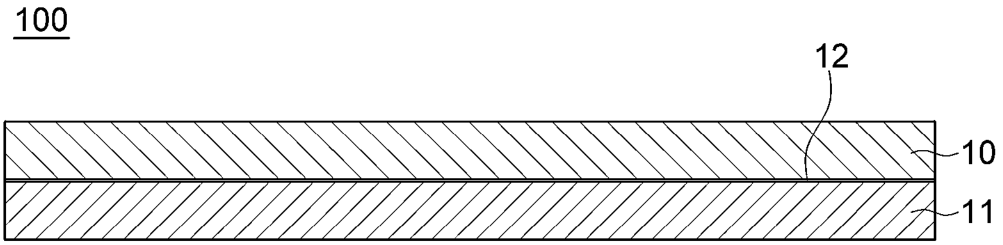
FIG. 1 is a cross-sectional view illustrating a structure of an electrolytic copper foil according to an embodiment of the present invention.

Hereinafter, the present invention will be described in detail.

All terms (including technical and scientific terms) used in this specification may be used in the meaning commonly understood by those of ordinary skill in the art to which the present invention pertains, unless otherwise defined. In addition, terms defined in a commonly used dictionary are not to be interpreted ideally or excessively, unless clearly defined in particular.

In addition, throughout this specification, when a part "includes" or "comprises" a certain element, it is to be understood as an open-ended term that includes the possibility of further including other elements rather than excluding other elements, unless otherwise stated. In addition, throughout the specification, "on" or "above" means not only when it is located on or beneath a target part, but also includes the case where there is another part therebetween, and does not mean that it is located upwardly with respect to the direction of gravity. In the present specification, terms such as "first" and "second" do not indicate any order or importance but are used to distinguish components from each other.

As used herein, "preferred" and "preferably" refer to embodiments of the present invention that may provide certain advantages under certain circumstances. However, other embodiments may also be preferred, under the same or other circumstances. Additionally, the recitation of one or more preferred embodiments does not imply that other embodiments are not useful, nor is it intended to exclude other embodiments from the scope of the invention.

<Double Layered Electrolytic Copper Foil>

An example of the present invention is an electrolytic copper foil applicable to a current collector of a secondary battery, a copper clad laminate (CCL), and/or a printed circuit board (PCB). Such an electrolytic copper foil is differentiated from the conventional copper foil in that the electrolytic copper foil according to the present invention includes a copper foil of double layers having different grain sizes, different crystal structures, or different physical properties from each other without a separate compression or bonding process.

Since the electrolytic copper foil is generally formed of a single layer through a foil making process, there is a problem in that it is difficult to control various physical properties such as tensile strength and elongation as desired. In order to control the physical properties of the electrolytic copper foil, for example, a separate surface treatment process may be performed or a functional layer for supplementing the physical properties of the copper foil may be additionally bonded, but in such a case, complexity of the process and increase in manufacturing costs are inevitably caused.

On the other hand, in the present invention, a double layered structure is formed by controlling process conditions such as electrolyte composition, current density, temperature, and/or agitation (e.g., flow rate) differently when manufacturing a first copper layer and a second copper layer forming the double layered structure. Since respective copper plating layers constituting the double layered structure may be implemented to have different physical properties from each other by controlling the above-described process conditions, various physical properties of the final double layered electrolytic copper foil may be freely controlled by controlling the physical properties and thickness of these copper plating layers. In addition, since the first copper layer and the second copper layer are connected with a continuous interface through a single electroplating process, physical stability is remarkably improved as compared to the conventional art of constructing a double layered copper foil by separate compression or bonding.

Hereinafter, a structure of the double layered electrolytic copper foil according to the present invention will be described with reference to FIG. 1. FIG. 1 is a cross-sectional view illustrating a structure of an electrolytic copper foil according to an embodiment of the present invention.

Referring to FIG. 1, a double layered electrolytic copper foil 100 according to the present invention includes a first copper layer 11; a second copper layer 12; and an interface 13 continuously formed between the first copper layer 11 and the second copper layer 12.

In such an embodiment, the first copper layer 11 and the second copper layer 12 may be different from each other in terms of a grain size constituting the copper foil, a crystal structure, and/or at least one of various physical properties required as a copper foil. Examples of such various physical properties may include, but are not particularly limited to, tensile strength and elongation.

In an embodiment, the double layered electrolytic copper foil 100 according to the present invention is an electrolytic copper foil doubly electrodeposited by a continuous electrolysis method. Accordingly, the first copper layer 11, the interface 13, and the second copper layer 12 constituting the double layered structure are bonded in a continuous phase through a single electroplating process, and the interface is present at a predetermined position along a thickness direction of the double layered electrolytic copper foil 100. The above-described double layered structure including the first copper layer 11, the interface 13, and the second copper layer 12 may be confirmed by a scanning electron microscope (SEM) photograph illustrating a cross-section of the double layered electrolytic copper foil 100, and specifically, it may be confirmed by electron backscatter diffraction (EBSD) of the electrolytic copper foil measured after heat treatment at 200° C. for 1 hour and before heat treatment.

For example, the interface 13 may be positioned at (e.g., within) a thickness in a range from 40% to 60% of a total thickness of the double layered electrolytic copper foil 100 in a thickness direction of the double layered electrolytic copper foil 100. In such a case, the position of the interface 13 may be based on one surface of the double layered electrolytic copper foil 100, that is, an electrolyte surface (M surface).

In the double layered electrolytic copper foil 100 manufactured through a foil making process by an electroplating method, a shiny surface (e.g., "S surface", drum surface, etc.) having relatively low roughness and high gloss is formed on one surface thereof, and a matte surface (e.g., an "M surface", an electrolyte surface, etc.) which has a relatively high roughness due to so-called mountain structures and thus has a low gloss is formed on another surface thereof.

For example, in the case of the double layered electrolytic copper foil 100 used as the current collector, a bonding force with an active material and a yield of the battery may greatly vary depending on a surface state of the double layered electrolytic copper foil 100. When surface non-uniformity due to the surface roughness of the copper foil is too high, there is a problem in that a discharge-capacity retention rate of the secondary battery is lowered, and on the other hand, when the surface of the copper foil is too uniform, it may be difficult to secure the binding force between the current collector and the active material, and thus the active material may be desorbed from the current collector during operation of the secondary battery, thereby causing problems such as an internal short circuit. In addition, according to a state of the copper foil, a difference in a coating amount of the active material between the opposite surfaces may be caused. The non-uniform coating amount between the opposite surfaces may cause a problem that a capacity of the electrode may decrease and/or unstable behavior of the electrode may occur due to a difference in deformation between the opposite surfaces of the current collector. Accordingly, in an embodiment of the present invention, by adjusting the surface roughness of the double layered electrolytic copper foil 100 to a predetermined range, it is possible to secure required physical properties of the double layered electrolytic copper foil 100, that is, an excellent bonding FORCE with the active materials and a high discharge capacity retention rate.

In an example, the double layered electrolytic copper foil 100 includes a drum surface and an electrolyte surface, and a surface roughness of the electrolyte surface may be in a range from approximately 1.0 to 5.0 μm, and specifically in a range from 1.0 to 4.0 μm, in terms of Rz (ten-point average roughness). More specifically, the surface roughness of the drum surface (e.g., S surface) of the copper foil may be in a range from 1.0 to 2.0 μm, and the surface roughness of the electrolyte surface (e.g., M surface) may be in a range from 1.0 to 5.0 μm.

In another example, a difference in surface roughness between the drum surface and the electrolyte surface of the double layered electrolytic copper foil 100 may be 1.0 μm or less, and specifically, 0.5 μm or less.

In addition, a thickness of the double layered electrolytic copper foil 100 may have a typical thickness range known in the art, but the present invention is not particularly limited thereto. For example, the thickness of the double layered electrolytic copper foil 100 may be in a range from 3 μm to 70 μm, specifically, in a range from 4 to 70 μm, and more specifically in a range from 15 to 70 μm. When the thickness of the double layered electrolytic copper foil 100 is too thin, it is difficult to handle the copper foil in a manufacturing process, thus lowering the workability, and on the other hand, when the thickness of the double layered electrolytic copper foil 100 is too thick, volume and weight may increase due to its thickness when the double layered electrolytic copper foil 100 is used as a current collector. In such a case, a thickness ratio of the first copper layer 11 and the second copper layer 12 constituting the double layered structure may be in a range from 40 to 60:60 to 40, but the present invention is not particularly limited thereto, and it may be appropriately adjusted considering various physical properties of the final double layered electrolytic copper foil.

The double layered electrolytic copper foil 100 according to the present invention preferably has excellent elongation and tensile strength, considering mechanical hardness, flexibility, and product reliability.

For example, the double layered electrolytic copper foil 100 may have an elongation in a range from 3.0 to 25% and a tensile strength in a range from 30 to 40 kgf/mm$^2$, and more specifically, an elongation in a range from 3.2 to 23.0% and a tensile strength in a range from 30 to 39.8 kgf/mm$^2$. However, the present invention is not limited thereto, and the elongation and the tensile strength may be appropriately adjusted considering the physical properties of the final double layered electrolytic copper foil.

Unless otherwise specified, the above-described physical properties of the double layered electrolytic copper foil 100 according to the present invention may be based on a thickness in a range from 3 to 200 μm of the copper foil. However, the present invention is not limited to the above-described thickness range.

The double layered electrolytic copper foil 100 according to the present invention is not particularly limited in terms of, for example, components, composition, and/or structure constituting the copper foil, as long as it has a double layered structure through a single electrolytic plating process without separate compression or bonding.

Each of the first copper layer 11 and the second copper layer 12 may include or be formed of copper or copper alloy known in the art, and in such a case, the metal component included in the alloy is not particularly limited, and a conventional metal known in the art may be used.

Each of the first copper layer 11 and the second copper layer 12 is a copper plating layer formed through electroplating in which a current is applied between an anode (e.g., positive electrode) plate and a rotating cathode (e.g., negative electrode) drum which are spaced apart from each other in an electrolyte. Each of the first copper layer 11 and the second copper layer 12 may be a general copper foil, a double-sided glossy copper foil, a high elongation copper foil, and/or a high strength (e.g., high tensile strength) copper foil according to electrolyte composition including copper ions and at least one additive, the type of additive applied, and/or their content control, but the present invention is not particularly limited thereto. The double layered electrolytic copper foil 100 may be in a foil shape, specifically, may be a flat copper foil.

Figure 2:
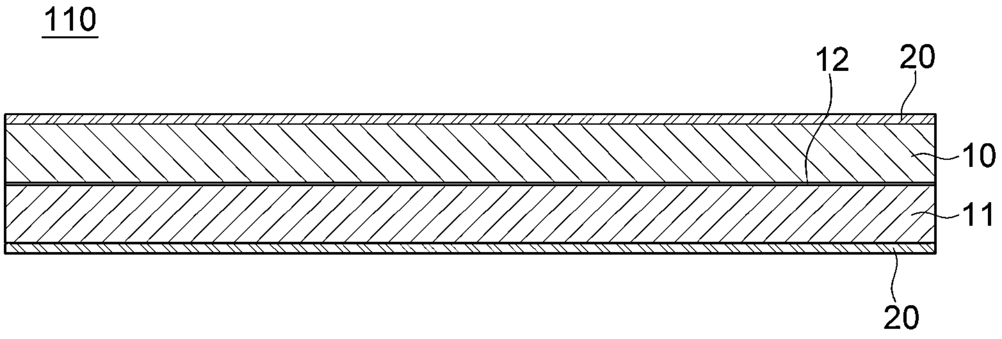
FIG. 2 is a cross-sectional view illustrating a structure of an electrolytic copper foil according to another embodiment of the present invention.

In an embodiment, referring to FIG. 2, the double layered electrolytic copper foil 100 according to an embodiment of the present invention may include an anti-corrosion layer (e.g., rust prevention layer) 20 formed on a surface thereof. Specifically, the anti-corrosion layer 20 may be formed on a surface (e.g., another surface) opposite to one surface of the first copper layer 11 contacting the interface 13 and on a surface (e.g., another surface) opposite to one surface of the second copper layer 12 contacting the interface 13.

The anti-corrosion layer 20 is selectively formed on an outermost surface of the double layered electrolytic copper foil 100 to prevent corrosion (e.g., rust). The anti-corrosion layer 20 may include conventional inorganic corrosion-resistant (e.g., rust-preventive) materials, organic corrosion-resistant materials, or mixtures thereof known in the art, for example, at least one or more of chromium (Cr), molybdenum (Mo), nickel (Ni), a silane compound, and a nitrogen compound.

In such a case, the nitrogen compound may include at least one or more of common triazole compounds and amine compounds known in the art. The applicable triazole compound may be selected from, for example, benzotriazole, tolyltriazole, carboxybenzotriazole, chlorobenzotriazole, ethylbenzotriazole and naphthotriazole. In addition, available amine compounds may be selected from, for example, amide, acrylamide, acetamide, auramine, dodecyltrimethyl ammonium bromide (DTAB) and diethylenetriamine (DETA).

The anti-corrosion layer 20 may serve to impart not only the anti-corrosion properties to the double layered electrolytic copper foil 100 described above, but also heat-resistance properties and/or properties to increase a bonding force with active materials.

Hereinafter, a method of manufacturing the double layered electrolytic copper foil 100 according to an embodiment of the present invention will be described. However, the present invention is not limited only by the following manufacturing method or sequence, and steps of each process may be modified or selectively mixed as needed.

The double layered electrolytic copper foil 100 according to the present invention may be manufactured through a conventional electrolytic foiling apparatus in the art.

Figure 3:
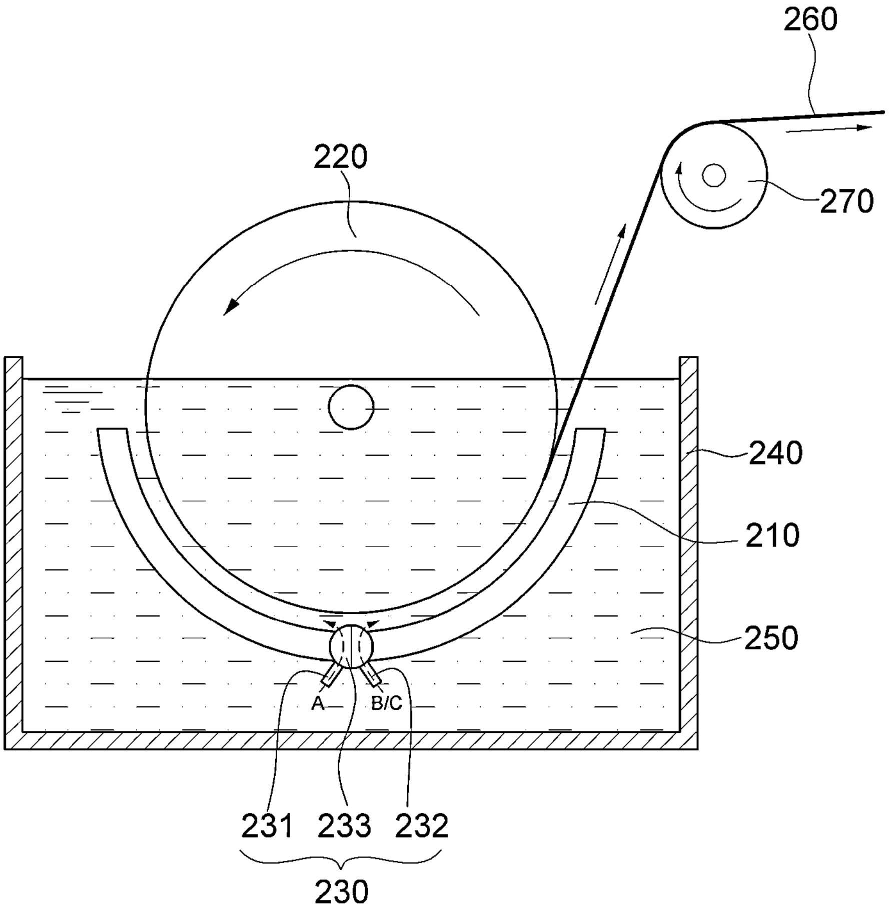
FIG. 3 is a view illustrating a method of manufacturing an electrolytic copper foil according to an embodiment of the present invention.

As an example, referring to FIG. 3, a drum 220 serving as a cathode and an anode plate 210 are installed in an electrolytic bath 240 to which an electrolyte 250 is continuously supplied, and a predetermined current is applied in a state that the drum 220 and the anode plate 210 are spaced apart from each other so that the electrolyte 250 may be interposed therebetween. In such a case, as the drum 220 rotates, an electrolytic copper foil 260 is electrodeposited on a surface of the drum 220, and then the electrodeposited electrolytic copper foil 260 is wound through a guide roll 270.

In the present invention, in order to manufacture an electrolytic copper foil having a double layered structure with different grain sizes, different crystal structures and/or different physical properties through a single electroplating process, an electrolytic bath including a plurality of inlets 231 and 232 for supplying electrolytes having different compositions, and an electrolyte input controller 230 including a valve 233 for opening and closing the inlets 231 and 232 may be used. Such an electrolytic bath is not particularly limited, but may include, for example, a first inlet for supplying a first electrolyte, a second inlet for supplying a second electrolyte, and a valve for opening and closing the first inlet and the second inlet.

According to an embodiment of the present invention, the method of manufacturing the double layered electrolytic copper foil may include a first step of electrodepositing a first copper layer on the rotating cathode drum by applying a current to a first electrolyte provided in an electrolytic bath; and a second step of electrodepositing a second copper layer on the first copper layer by applying a current to a second electrolyte, where the process conditions of each step may be adjusted within a predetermined range.

First, the anode 210 in a semi-cylindrical shape and the rotating cathode drum 220 are disposed apart from each other at a predetermined interval in the electrolytic bath 240 including the first inlet 231, the second inlet 232, and the valve 233.

The anode 210 is not particularly limited, and for example, a lead alloy or titanium coated with iridium oxide may be used. In addition, as the cathode 220, chromium-plated stainless steel may be used. However, the present invention is not limited thereto.

Next, the first electrolyte is continuously supplied between the anode 210 and the rotating cathode drum 220 in the electrolytic bath 240 through the first inlet 231 provided in the electrolytic bath 240. Then, when a direct current is applied between the anode 210 and the cathode 220, in the cathode 220, copper ions in the first electrolyte are reduced to a metal of a predetermined thickness and precipitated, thereby forming the first copper layer.

Then, when a direct current is applied between the anode 210 and the cathode 220 after continuously supplying the second electrolyte through the second inlet 232 provided in the electrolytic bath 240, on the first copper layer 11 of the rotating cathode drum 220, copper ions in the second electrolyte are reduced to a metal of a predetermined thickness to electrodeposit the second copper layer, and thus a double layered structure is formed.

In particular, in the present invention, in order to effectively control the grain size, crystal structure and/or physical properties of the first copper layer 11 and the second copper layer 12 constituting the double layered electrolytic copper foil 100, at least one of the process conditions of the first step of electrodepositing the first copper layer and the process conditions of the second step of electrodepositing the second copper layer, for example, at least one process condition of a concentration of copper ions included in the electrolyte, an applied current density, a temperature of the electrolyte, and an agitation (e.g., flow rate) of the electrolyte supplied to or circulated on the cathode drum is controlled differently.

When controlling process conditions such as copper ion concentration, current density, agitation, and electrolyte temperature during electroplating, the grain size or crystal structure of the electrodeposited copper layer may be controlled. In general, when the grain size is large, a tensile strength of the copper foil decreases and an elongation increases, and on the other hand, when the grain size is small, the tensile strength of the copper foil increases and the elongation decreases.

Specifically, when the concentration of copper ions in the electrolyte is increased, the grain size increases due to a decrease in surface polarization, and the tensile strength decreases, but the elongation increases. In addition, when the speed, that is, agitation, of the electrolyte supplied to or circulated on the drum surface increases, copper ions are smoothly supplied to the drum surface, resulting in increased copper ion concentration in the electrolyte, such that grains become large, the tensile strength decreases, and the elongation increases. On the other hand, when the agitation of the electrolyte is low, the copper ion concentration on the drum surface is lowered in high-speed plating, such that the grains become small, the tensile strength increases, and the elongation decreases. The temperature also shows similar results to the agitation and copper ion concentration described above. On the other hand, when the applied current density increases, the grain size decreases, the tensile strength increases, and the elongation increases. In addition, additives included in the electrolyte may increase or decrease the grain size according to the unique properties of the additives. For example, a brightener accelerates self-annealing to increase the grain size, and conversely, a leveler decreases the grain size.

In the present invention, the first electrolyte for forming the first copper layer 11 and the second electrolyte for forming the second copper layer 12 may each use conventional electroplating electrolyte components known in the art without limitation. For example, the first electrolyte and the second electrolyte may be different from each other and may each include copper ions; sulfuric acid; halogen; and at least one additive of a brightener, a leveler, a suppressor (e.g., inhibitor) and a carrier.

For example, each of the first electrolyte and the second electrolyte may include copper ions in an amount ranging from 50 to 120 g/L, and specifically, 60 to 100 g/L, and may include copper sulfate including, for example, 50 to 150 g/L of sulfuric acid. In addition, a chlorine ion concentration may be in a range from 0.1 to 70 ppm, and a concentration of organic impurities (TOC) in the electrolyte may be limited to 1000 ppm.

In addition, as the at least one additive added to the first electrolyte and the second electrolyte, any additive commonly used in the field of electroplating may be used without limitation. For example, a sulphonate-based additive including sulfide as an accelerator (brightener) for imparting gloss to the plating surface and obtaining a fine plating layer; a gelatin having a molecular weight in a range from 1,000 to 100,000, polyethylene glycols (PEG), polypropylene glycols (PPG), or a low molecular weight gelatin as a carrier for controlling a roughness of the copper foil; a cellulose-based additive as a suppressor for realizing stable low roughness; and/or a mixture of one or more kind thereof may be included. Applicable organic additives may include hydroxyethyl cellulose (HEC), 3-(benzothiazolyl-2-mercapto)-propyl-sulfonic acid, low molecular weight nitrides (e.g., thiourea series, amides, benzimidazole series, benthiazol series, dimethyl aniline, etc.) as a leveler for lowering roughness of the copper foil and imparting high strength (e.g., tensile strength).

A specific example of the above-described at least one additive may include 1 to 3000 ppm of HEC, bis-(3-sulfopropyl) disulfide (SPS) as the brightener/accelerator, 0.5 to 1500 ppm of 3-mercaptopropyl sulfonate (MPS), 1 to 10000 ppm of a low molecular weight gelatin, and 0.05 to 1500 ppm of thiourea. However, the present invention is not particularly limited thereto.

In addition, in the electrodepositing of the first copper layer 11 and the second copper layer 12, the electroplating conditions for each step are not particularly limited, and may be appropriately adjusted within a range known in the art. For example, the current densities applied to the first electrolyte and/or the second electrolyte may be the same as or different from each other, specifically in a range from 30 to 100 A/dm$^2$, and more specifically in a range from 40 to 80 A/dm$^2$.

In addition, the temperatures of the first electrolyte and/or the second electrolyte may be the same as or different from each other, for example, in a range from 35 to 75° C., and specifically in a range from 40 to 60° C.

In addition, the agitations of the first electrolyte and the second electrolyte may be the same as or different from each other, for example, in a range from 30 to 120 m$^3$/hr, and specifically in a range from 50 to 100 m$^3$/hr. However, the present invention is not particularly limited to the above-described range.

Then, by stripping and continuously winding the electrolytic copper foil 260 in which the first copper layer 11 and the second copper layer 12 are sequentially electrodeposited from the surface of the cathode drum 220, the double layered electrolytic copper foil 100 may be obtained If necessary, the obtained double layered electrolytic copper foil 100 may be further subjected to at least one surface treatment of nodule treatment and rust prevention treatment known in the art.

As such, in the present invention, the double layered electrolytic copper foil 100 including the first copper layer 11 and the second copper layer 12 has been specifically illustrated and described. However, the present invention is not limited thereto, and it is also within the scope of the present invention to constitute an electrolytic copper foil having a multilayer structure of three or more layers.

In the double layered electrolytic copper foil 100 of the present invention manufactured as described above, various physical properties required as a copper foil, for example, tensile strength, elongation, hardness, and/or flexibility may be freely controlled, while effectively controlling factors such as a difference in roughness between opposite surfaces and a thickness ratio between each copper layer. Accordingly, the double layered electrolytic copper foil 100 may be usefully used as a copper clad laminate, a printed circuit board, and/or a current collector of a battery. In addition, it may be applicable without limitation to various technical fields in which copper foil is used in the pertinent art.

Hereinafter, the present invention will be described in detail through examples. However, the following examples are only provided to illustrate the present invention, and the present invention is not limited by the following examples.

Examples 1 to 8: Preparation of Double Layered Electrolytic Copper Foil

A double layered electrolytic copper foil was manufactured using the electrolytic apparatus illustrated in FIG. 3.

A first copper layer was formed by adding a first electrolyte into an electrolytic bath, immersing an anode and a rotating cathode drum to be spaced apart from each other in a first electrolyte, and applying a current therebetween. Specifically, in order to prepare the first electrolyte, adjustment was made to a copper ion concentration of 70 g/L or 80 g/L, a sulfuric acid concentration of 100 g/L, and a chloride ion concentration of 35 ppm at a temperature of 60° C. In addition, an additive G included a low molecular weight gelatin (molecular weight of 3,000), an additive B included 3-mercaptopropyl sulfonate (MPS), and an additive T included thiourea as a leveler, and their contents were G (3.5 ppm), B (1.5 ppm), T (0.2 ppm), respectively. In such a case, the composition of the first electrolyte, current density, temperature, and agitation conditions for forming the first copper layer are respectively as shown in A of Table 1 below.

Then, after adding a second electrolyte into the electrolytic bath, a second copper layer was electrodeposited on the first copper layer by controlling the current density, temperature, and agitation conditions. In such a case, the composition of the second electrolyte, current density, temperature, and agitation conditions for forming the second copper layer are as shown in B or C of Table 1 below. Thereafter, chromium (Cr) treatment was performed through immersion in a small bath to give corrosion preventing ability.

Experimental Example 1: Cross-Section Evaluation of Double Layered Electrolytic Copper Foil In order to analyze a crystal structure of the double layered electrolytic copper foil, cross-sectional structures of the electrolytic copper foils prepared in Examples 1 to 4 and Comparative Example 1 were observed with a scanning electron microscope (SEM).

Figure 4:
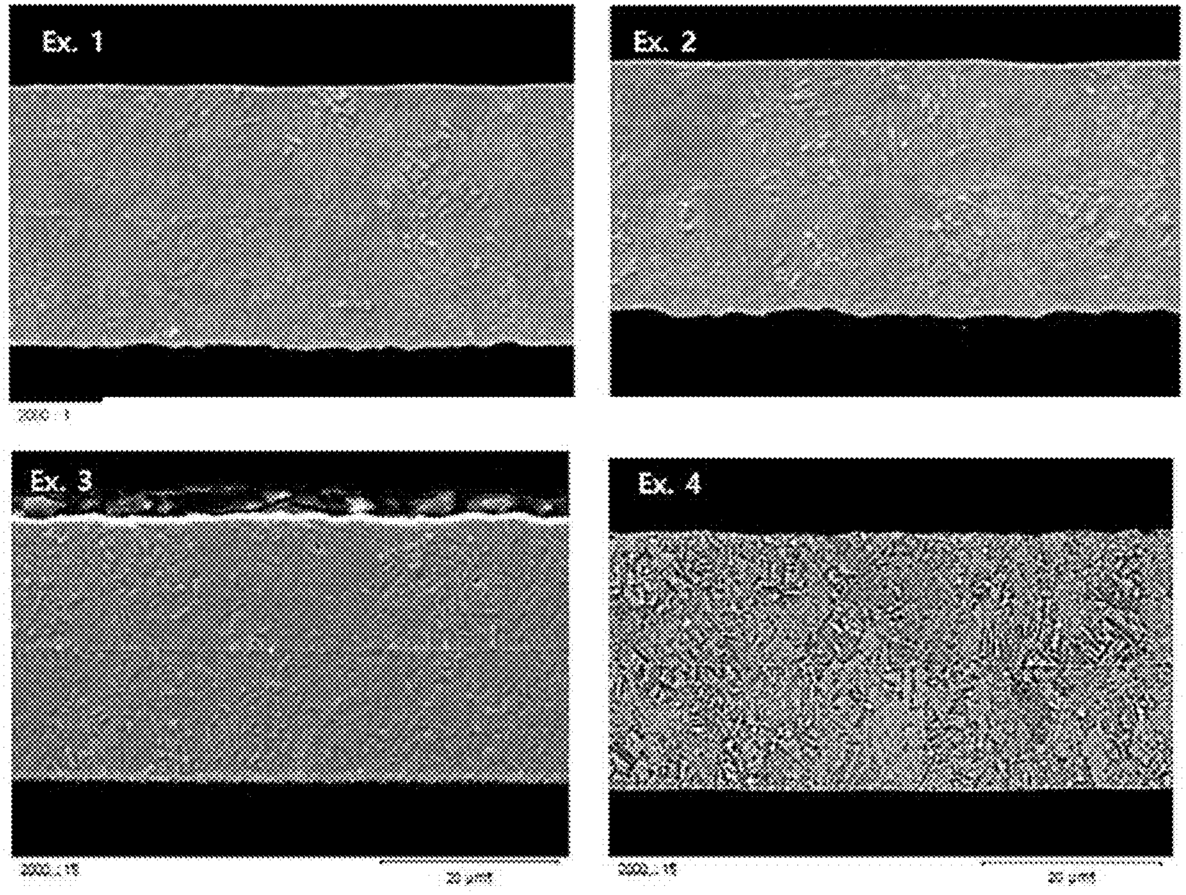
FIG. 4 is a SEM photograph illustrating a cross-section of a double layered electrolytic copper foil prepared in Examples 1 to 4.
Figure 5:
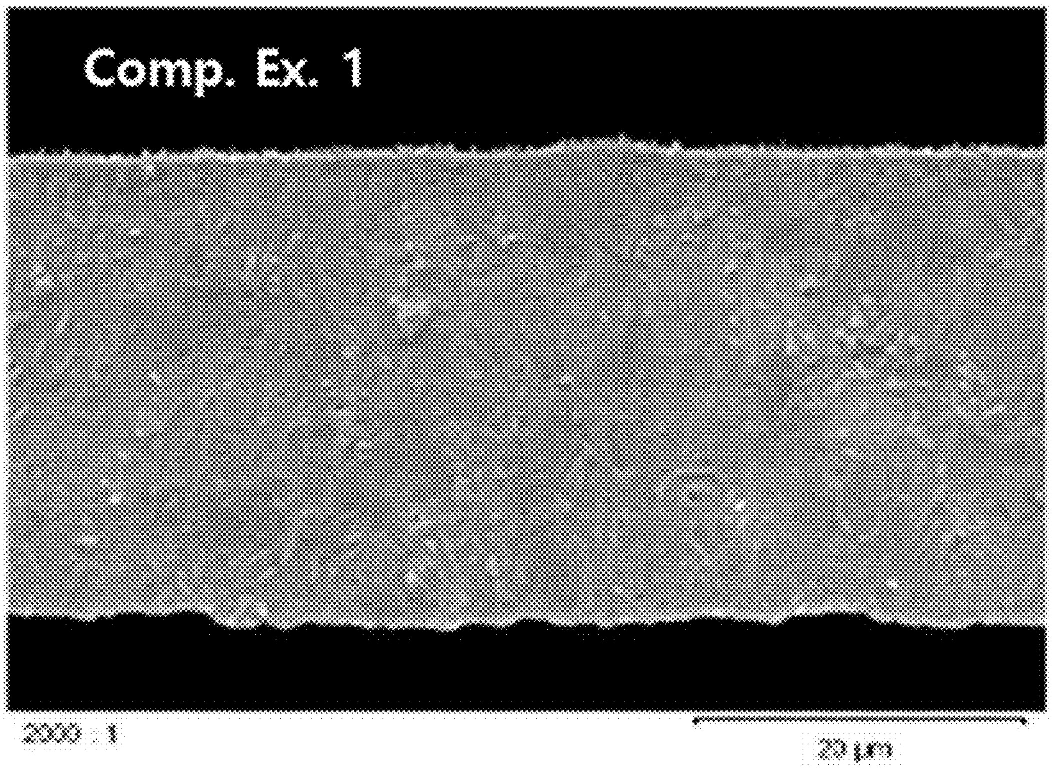
FIG. 5 is an SEM photograph illustrating a cross-section of a single-layer electrolytic copper foil prepared in Comparative Example 1.

FIG. 4 is a SEM photograph illustrating a cross-section of a double layered electrolytic copper foil prepared in Examples 1 to 4, and FIG. 5 is an SEM photograph illustrating a cross-section of a single-layer electrolytic copper foil prepared in Comparative Example 1.

Dissimilar to the electrolytic copper foil of Comparative Example 1 (see FIG. 5) in which an interface does not exist, it was confirmed that the electrolytic copper foils of Examples 1 to 4 have a double layered structure including a first copper layer and a second copper layer, and that a continuous interface was formed between the first copper layer and the second copper layer (see FIG. 4).

Experimental Example 2: Evaluation of Crystal Structure of Double Layered Electrolytic Copper Foil In order to analyze a crystal structure of the double layered electrolytic copper foil, electron backscatter diffraction (EBSD) analysis was performed before and after heat treatment of the electrolytic copper foil.

As a sample, the electrolytic copper foils prepared in Example 1 and Comparative Example 1 were used. EBSD analysis was performed using the electrolytic copper foil before heat treatment, and then, after heat treatment at 200° C. for 1 hour, EBSD analysis was performed again.

TABLE 1

| | | Electrolyte composition: Cu (g/L) A | Cu (g/L) B | Additive (ppm) A | Additive (ppm) B | Additive (ppm) C | Current density ($A/dm^2$) A | Current density ($A/dm^2$) B | Temperature (° C.) A | Temperature (° C.) B | Agitation ($m^3/hr$) A | Agitation ($m^3/hr$) B |
|---|---|---|---|---|---|---|---|---|---|---|---|---|
| | | 80 | 70 | G + B | G + B | G + B + T | 45 | 50 | 45 | 50 | 50 | 45 |
| Ex. | 1 | 80 | 70 | 5 | — | — | 45 | 45 | 45 | 45 | 45 | 45 |
| | 2 | 80 | 80 | 5 | 10 | — | 45 | 45 | 45 | 45 | 45 | 45 |
| | 3 | 80 | 80 | 5 | — | G + B + T (5.2) | 45 | 45 | 45 | 45 | 45 | 45 |
| | 4 | 80 | 80 | G + B + T (5.2) | — | G + B (5) | 45 | 45 | 45 | 45 | 45 | 45 |
| | 5 | 80 | 80 | G only (5) | 10 | — | 45 | 45 | 45 | 45 | 45 | 45 |
| | 6 | 80 | — | 5 | — | — | 45 | 50 | 45 | 45 | 45 | 45 |
| | 7 | 80 | 80 | 5 | — | — | 45 | 45 | 45 | 50 | 45 | 45 |
| | 8 | 80 | 80 | 5 | — | — | 45 | 45 | 45 | 45 | 50 | 45 |
| Comp. Ex. | 1 | 80 | 80 | 5 | — | — | 45 | 45 | 45 | 45 | 45 | 45 |
| | 2 | 70 | 70 | — | 10 | — | 45 | 45 | 45 | 45 | 45 | 45 |
| | 3 | 70 | 70 | G only (5) | — | — | 45 | 45 | 45 | 45 | 45 | 45 |
| | 4 | 70 | 70 | — | — | G + B + T (5.2) | 45 | 45 | 45 | 45 | 45 | 45 |

Comparative Examples 1-4: Electrolytic Copper Foil Manufacturing

Electrolytic copper foils of Comparative Examples 1 to 4 were manufactured in the same manner as in Example 1, except that the electrolysis conditions were changed as shown in Table 1 above.

In such a case, Bruker's equipment was used for EBSD analysis, and a minimum pixel size was set to 100 nm or less, and a magnification was set to 5000 times. Analysis was conducted based on results of orientation and diffraction patterns of materials analyzed using a pattern quality map (PQ map) and an inverse pole figure map (IPF map). In such a case, the PQ Map expresses a difference in signal intensity of electric charges (e.g., electrons, backscattered electrons)

reflected from the sample as a difference in contrast (e.g., light and dark), and is generally expressed darkly at grain boundaries because the signal is weak. In addition, the IPF Map expresses a difference in a crystal direction (orientation) of the sample in color. The term “twin” means a plane that is 60° misorientated with respect to a crystal plane of the sample.

Figure 6A:
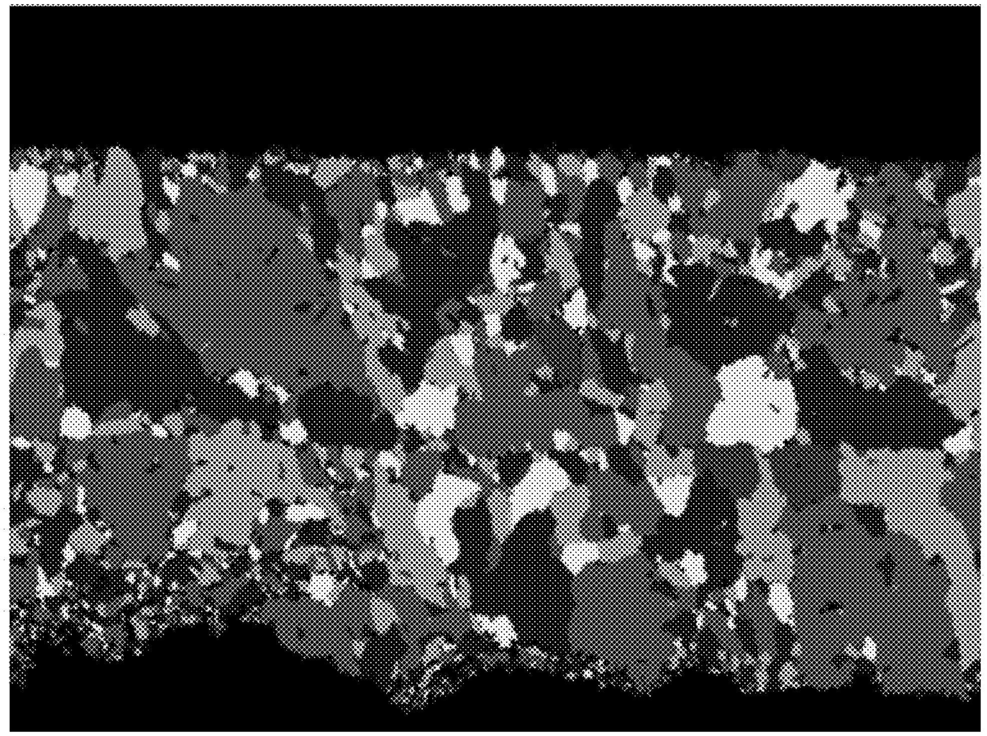
FIG. 6A and FIG. 6B are EBSD images illustrating the double layered electrolytic copper foil prepared in Example 1 before and after heat treatment, respectively.
Figure 6B:
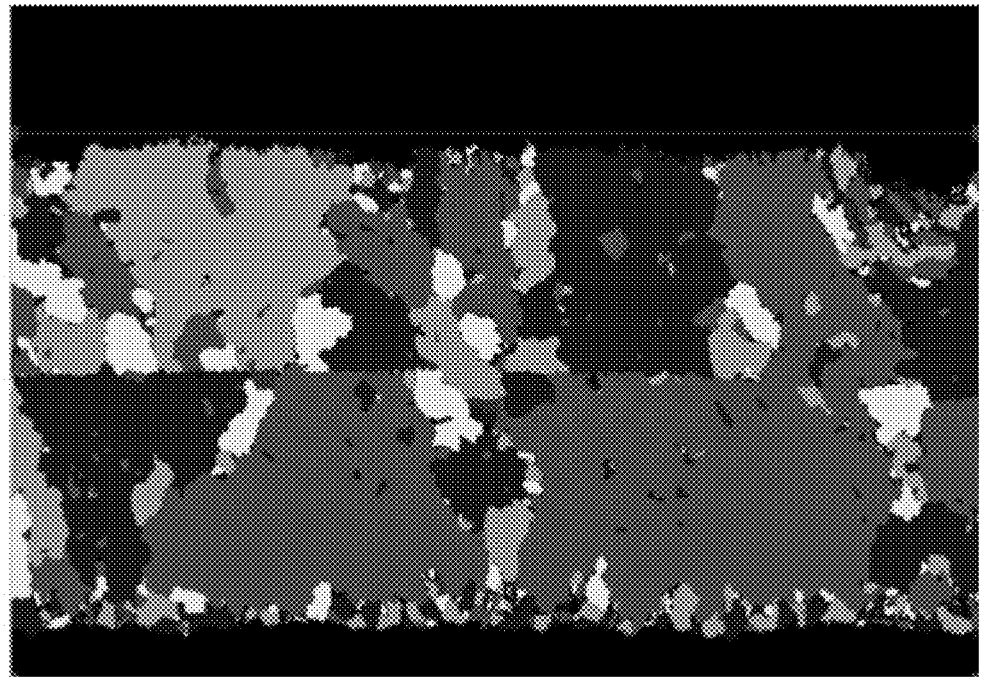
Figure 7A:
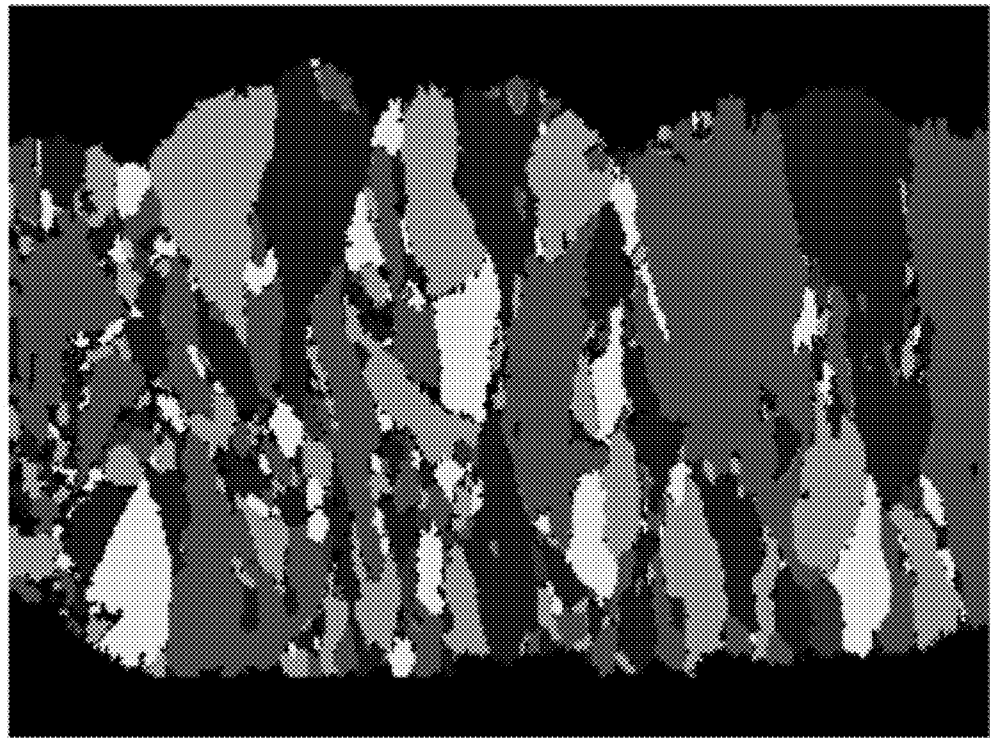
FIG. 7A and FIG. 7B are EBSD images illustrating the electrolytic copper foil prepared in Comparative Example 1 before and after heat treatment, respectively.
Figure 7B:
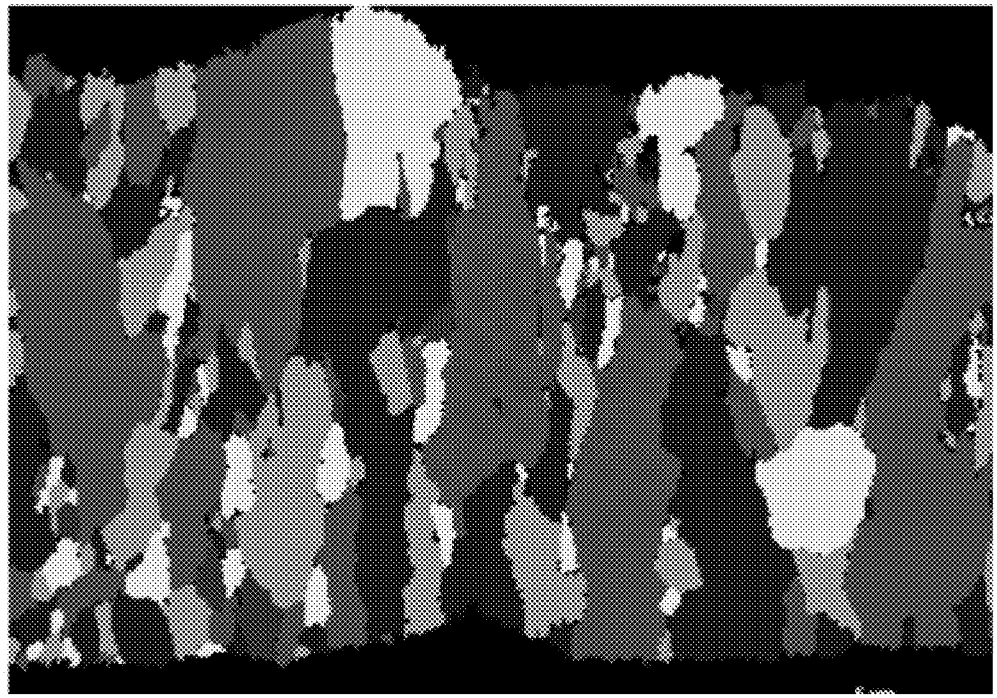

FIG. 6A and FIG. 6B are EBSD images of the double layered electrolytic copper foil prepared in Example 1 before heat treatment (FIG. 6A) and after heat treatment (FIG. 6B), and FIG. 7A and FIG. 7B are EBSD images of the electrolytic copper foil prepared in Comparative Example 1 before heat treatment (FIG. 7A) and after heat treatment (FIG. 7B). In each of the EBSD analysis photos of FIGS. 6A, 6B, 7A, and 7B, twin boundaries are removed.

In the double layered electrolytic copper foil of Example 1, an interface was confirmed at a thickness in a range from 3 to 70 μm, and preferably, it was observed more easily at a thickness in a range from 15 to 70 μm.

In the case of the electrolytic copper foil of Comparative Example 1, there was no significant change between the EBSD images before and after heat treatment, and there was no interface in the electrolytic copper foil. On the other hand, in the case of the electrolytic copper foil of Example 1, it was confirmed that there were a first copper layer and a second copper layer having different grains and/or sizes from each other before and after heat treatment, and that there was an interface continuously formed therebetween.

Experimental Example 3: Evaluation of Physical Properties of Double Layered Electrolytic Copper Foil The physical properties of the double layered electrolytic copper foils prepared in Examples 1 to 8 and Comparative Examples 1 to 4 were evaluated in the following manner, and the results are shown in Table 2 below.

<Method for Evaluating Physical Properties>

(1) Thickness Measurement

A thickness was measured by a unit basis weight method, which is a typical thickness measurement method of copper foil (IPC-TM-650 2.2.12).

(2) Surface Roughness Measurement

A roughness of the copper foil was measured based on Rz using a shape measuring instrument (MarSurf, model name: M 300 C Mobile roughness measuring instrument) (IPC-TM-650 2.2.17).

(3) Measurement of Elongation and Tensile Strength

A tensile strength (MPa) and an elongation were each measured using UTM (Instron, model name: 5942) in accordance with IPC-TM-650 2.4.18 standard.

TABLE 2

| Sample | | Thickness (μm) | Tensile strength (kgf/mm$^2$) | Elongation (%) | Roughness (μm, Rz ISO, Electrolyte surface) |
|---|---|---|---|---|---|
| Ex. | 1 | 12 | 32.7 | 7.5 | 2.4 |
| | 2 | 12 | 30.1 | 22.0 | 1.9 |
| | 3 | 12 | 39.6 | 3.5 | 2.8 |
| | 4 | 12 | 37.2 | 4.2 | 2.4 |
| | 5 | 12 | 33.0 | 5.5 | 4.5 |
| | 6 | 12 | 32.5 | 7.0 | 2.7 |
| | 7 | 12 | 32.5 | 7.2 | 2.1 |
| | 8 | 12 | 33.0 | 7.5 | 2.1 |
| Comp. | 1 | 12 | 32.5 | 7.5 | 0.8 |
| Ex. | 2 | 12 | 22.5 | 34.0 | 1.8 |
| | 3 | 12 | 36.0 | 4.5 | 8.2 |
| | 4 | 12 | 84.5 | 1.5 | 3.0 |

As shown in Table 2, in the double layered electrolytic copper foil of the present invention, various physical properties required as a copper foil, for example, tensile strength, elongation, and roughness, may be freely controlled by controlling at least one electrolysis conditions such as electrolyte composition, current density, temperature, and/or agitation.

Accordingly, it was appreciated that the double layered electrolytic copper foil according to the present invention may be usefully applied to various fields in which copper foil is used in the pertinent art, for example, a copper clad laminate, a printed circuit board, and/or a current collector of a battery.

What is claimed is:

1. A double layered electrolytic copper foil comprising:

a first copper layer;

a second copper layer; and an interface formed between one surface of the first copper layer and one surface of the second copper layer, wherein the first copper layer and the second copper layer have different grain sizes or different crystal structures from each other, an elongation of the double layered electrolytic copper foil is in a range from 3.0 to 25%, and a tensile strength of the double layered electrolytic copper foil is in a range from 30 to 40 kgf/mm$^2$.

2. The double layered electrolytic copper foil of claim 1, wherein the first copper layer and the second copper layer are bonded at the interface in a continuous phase through a single electroplating process.

3. The double layered electrolytic copper foil of claim 1, wherein a double layered structure including the first copper layer, the interface and the second copper layer is identified by electron backscatter diffraction (EBSD) measured after heat treatment at 200° C. for 1 hour and before heat treatment.

4. The double layered electrolytic copper foil of claim 1, wherein the interface is positioned at a thickness in a range from 40 to 60% of a total thickness of the double layered electrolytic copper foil in a thickness direction of the double layered electrolytic copper foil.

5. The double layered electrolytic copper foil of claim 1, wherein a thickness ratio of the first copper layer and the second copper layer is in a range from 40:60 to 60:40.

6. The double layered electrolytic copper foil of claim 1, wherein a thickness of the double layered electrolytic copper foil is in a range from 3 to 70 μm.

7. The double layered electrolytic copper foil of claim 1, wherein the double layered electrolytic copper foil comprises a drum surface and an electrolyte surface, and a roughness (Rz, ISO) of the electrolyte surface is in a range from 1.0 to 5.0 μm.

8. The double layered electrolytic copper foil of claim 7, wherein a difference in surface roughness between the drum surface and the electrolyte surface is 1.0 μm or less.

9. The double layered electrolytic copper foil of claim 1, further comprising an anti-corrosion layer formed on another surface of the first copper layer and on another surface of the second copper layer.

10. The double layered electrolytic copper foil of claim 1, applied to at least one of a copper clad laminate, a printed circuit board, and a current collector of a battery.

11. A method of manufacturing a double layered electrolytic copper foil by applying a current between an anode and a rotating cathode drum spaced apart from each other in an electrolytic bath in which an electrolyte is accommodated, the method comprising:

a first step of electrodepositing a first copper layer on the rotating cathode drum by applying a current to the electrolyte; and a second step of electrodepositing a second copper layer on the first copper layer by applying a current to the electrolyte, wherein at least one of a concentration of copper ions comprised in the electrolyte, a current density, an electrolyte agitation, and an electrolyte temperature is different from each other between the first step and the second step, the first copper layer and the second copper layer have different grain sizes or different crystal structures from each other, an elongation of the double layered electrolytic copper foil is in a range from 3.0 to 25%, and a tensile strength of the double layered electrolytic copper foil is in a range from 30 to 40 $kgf/mm^2$.

12. The method of claim 11, wherein at least one of the concentration of copper ions comprised in the electrolyte, the electrolyte temperature and the electrolyte agitation circulated on a surface of the cathode drum in the first step is greater than a corresponding one of the concentration of copper ions comprised in the electrolyte, the electrolyte temperature and the electrolyte agitation in the second step.

13. The method of claim 11, wherein the current density in the first step is less than the current density in the second step.

14. The method of claim 11, wherein the electrolyte of the first step and the electrolyte of the second step are different from each other and each include copper ions; sulfuric acid; halogen; and at least one additive of a brightener, a leveler, a suppressor and a carrier.

15. The method of claim 11, further comprising:

performing at least one of a nodule treatment and an anti-corrosion treatment on the electrodeposited double layered electrolytic copper foil.

* * * * *